United States Patent [19]
Casebolt

[11] Patent Number: 5,774,344
[45] Date of Patent: Jun. 30, 1998

[54] RF SHIELD FOR CIRCUIT CARD HAVING A SOLID FIRST FLANGE

[75] Inventor: Matthew P. Casebolt, Fremont, Calif.

[73] Assignee: Metricom, Inc., Los Gatos, Calif.

[21] Appl. No.: 569,403

[22] Filed: Dec. 6, 1995

Related U.S. Application Data

[60] Provisional application No. 60/004,197 Sep. 22, 1995.
[51] Int. Cl.$^6$ ....................................................... H05K 7/14
[52] U.S. Cl. .......................... 361/800; 361/816; 361/818; 361/799; 361/791; 174/51
[58] Field of Search .................................... 361/816, 818, 361/752, 753, 800, 799, 737, 791, 802, 212, 220, 814; 174/35 R, 35 GC, 35 TC, 51; 307/89.9; 330/68; 334/85

[56] References Cited

U.S. PATENT DOCUMENTS

| | | | |
|---|---|---|---|
| 3,721,746 | 3/1973 | Knappenberger | 174/35 MS |
| 4,754,101 | 6/1988 | Stickney et al. | 174/35 R |
| 5,095,177 | 3/1992 | Johnson | 174/35 R |
| 5,160,807 | 11/1992 | Fry et al. | 174/35 R |
| 5,175,395 | 12/1992 | Moore | 174/35 R |
| 5,354,951 | 10/1994 | Lange, Sr. et al. | 174/35 R |

*Primary Examiner*—Leo P. Picard
*Assistant Examiner*—Anthony Dinkins
*Attorney, Agent, or Firm*—Townsend and Townsend and Crew LLP; Kenneth R. Allen

[57] ABSTRACT

A metallized plastic RFI/EMI shield is provided against electromagnetic energy for a circuit card wherein the shield is formed of a box enclosure with two casing halves to enclose the card, the first casing half having a solid flange side walls surrounding the card and the second casing half having a flange formed by flat, plate-like closely-spaced fingers, the fingers confronting, being in electrical contact with and mating in full length with substantially the entire periphery of the side walls of the first casing half. The fingers are preferably spaced with a separation of less than ¼ wavelength of any measurable harmonic of the intended operating frequency, typically up to the tenth harmonic. A slot may be provided to receive the fingers on the outside of the side walls, and closely-spaced grounding pins arranged around the periphery of the card may extend between the first and second casing halves through ground plated perforations along the edge of the side walls.

18 Claims, 2 Drawing Sheets

RF SHIELD FOR CIRCUIT CARD HAVING A SOLID FIRST FLANGE

CROSS-REFERENCE TO RELATED APPLICATION

This application claims benefit of provisional patent application Serial No. 60/004,197, filed Sep. 22, 1995.

BACKGROUND OF THE INVENTION

This invention relates to electromagnetic shielding problems confronting radio frequency circuits. More particularly, the invention relates to a manufacturable shielding enclosure for circuit cards which emit unwanted electromagnetic radiation.

Shielding against unwanted high frequency r.f. emissions is a challenge, since any seemingly small aperture in a shielding enclosure may inadvertently form a radiating aperture in the nature of a slot antenna structure. In the prior art, it has been necessary to provide several levels or layers of shielding to prevent unwanted emissions and to meet regulatory standards for emission suppression. It has been observed that a major source of leakage is perimeter apertures in the shield. However, manufacturability is an important consideration in mass production applications. It is costly and impractical to test and customize each and every enclosure during assembly to assure emissions standards compliance. What is needed is an enclosure which is readily manufactured, easily assembled with a circuit card and essentially fully immune to unwanted r.f. emissions.

SUMMARY OF THE INVENTION

According to the invention, a metallized plastic RFI/EMI shield is provided against electromagnetic energy for a circuit card wherein the shield is formed of a box enclosure with two casing halves to enclose the card, the first casing half having a solid flange side walls surrounding the card and the second casing half having a flange formed by flat, plate-like closely-spaced fingers, the fingers confronting, being in electrical contact with and mating in full length with substantially the entire periphery of the side walls of the first casing half. The fingers are preferably spaced with a separation of less than ¼ wavelength of any measurable harmonic of the intended operating frequency, typically up to the tenth harmonic. A slot may be provided to receive the fingers on the outside of the side walls, and closely-spaced grounding pins arranged around the periphery of the card may extend between the first and second casing halves through ground plated perforations along the edge of the side walls.

The invention will be better understood upon reference to the following detailed description in connection with the accompanying drawings.

DESCRIPTION OF THE PREFERRED EMBODIMENT

Figure 1:
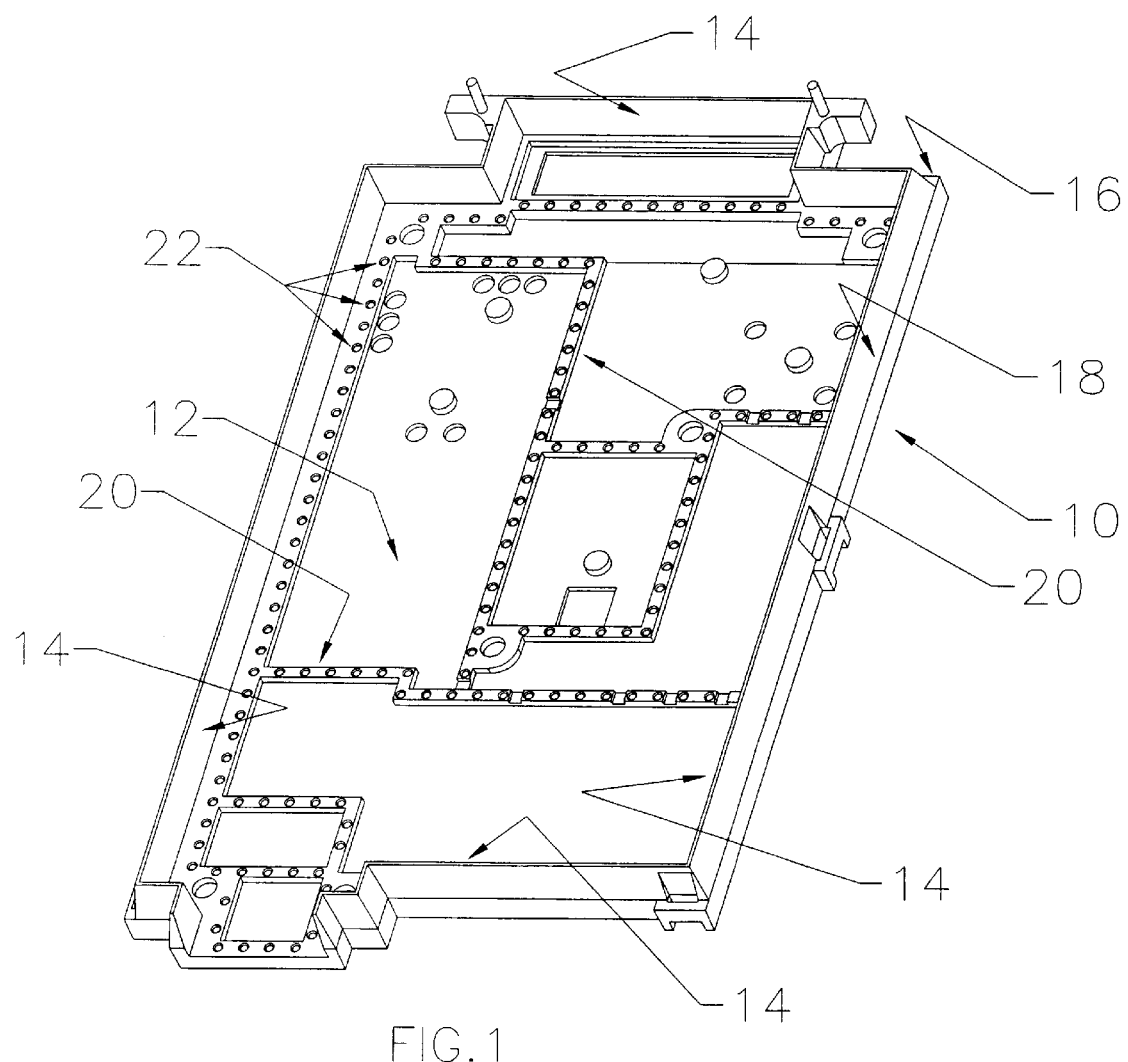
FIG. 1 is a perspective view of a first casing half of an enclosure.

FIG. 1 is a perspective view of a first casing half 10 an enclosure according to the invention. Designated arbitrarily the upper half casing, this half 10 comprises a solid base 12 and a side wall 14 of a solid flange extending along the entire enclosure periphery. Optionally there may be a lip 16 outside the side wall 14 to define a slot 18 between the lip 16 and the side wall 14 all along the periphery of the base 12. As understood, each circuitous path for an r.f. signal increases path loss and thus adds to the effectiveness of suppression. Within the interior, there are internal isolation walls 20, some of which are disposed along the side walls, and some of which traverse the base. As shown in this embodiment, the internal isolation walls 20 have along their (inwardly-directed) edges regular, closely-spaced indentations 22 or holes. Alternatively, the indentations may be protrusions or pins which mate to such indentations 22. As hereinafter explained, these indentations and protrusions form another level of shielding and grounding for spurious emissions.

Figure 2:
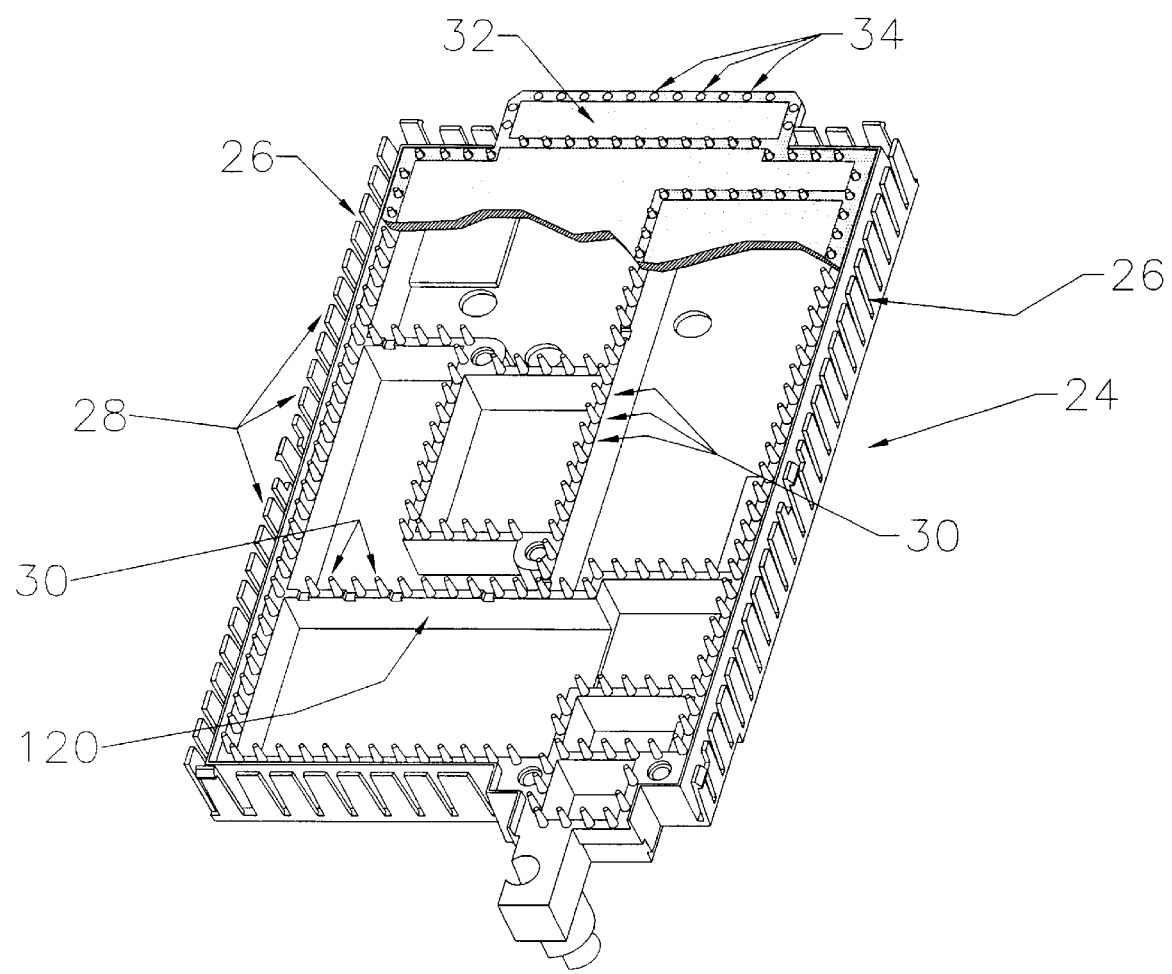
FIG. 2 is a perspective view of a second casing half of an enclosure which mates with the first half casing to form an effective r.f. shield according to the invention.

Referring now to FIG. 2, there is a perspective view of a second casing half 24 of an r.f shield according to the invention. Together the casing halves 10 and 24 form an effective box enclosure r.f. shield according to the invention. The second casing half 24 mates intimately with the first casing half 10 to form the desired level of shielding. The structure of the second casing half 24 is instructive. According to the invention, there is provided a second flange 26 all along the periphery which is formed of closely-spaced fingers 28. The fingers 28 are generally flat, flexible plates wherein the inwardly-disposed surface conforms closely with the contour of the outer surface of the flange 16 of the mating first casing half 10. The fingers 28 and the flange 16 slidably contact one another when the two casing halves are mated. The fingers 28 extend into the optional slot 18 to establish the circuitous path for r.f.

The fingers 28 are closely spaced to one another, typically having narrow slots with side-to-side spacing of far less than a quarter wavelength. Preferably the spacing is less than ¼ wavelength of the highest measurable harmonic of the operating frequency of the fundamental of the r.f. emission. A typical spacing is ¼ wavelength at the tenth harmonic (⅛ wavelength of the fifth harmonic). The narrow spacing has been found to be adequate to provide an effective r.f. seal to the edges while providing a good mechanical slide fit. The plate-like fingers 28 produce a flexible, self-sustaining lateral pressure fit against the solid flange 14.

The material forming the shield may be metal or metallized plastic, that is, plastic coated or plated with copper and nickel. The copper provides electromagnetic shielding and the nickel provides abrasion resistance. Various processes are known in the art to achieve a substantially uniform effective coating.

The enclosure is for enclosing a circuit card 32 (in phantom in FIG. 2) wherein the circuit card 32 conforms with the enclosure. In accordance with the invention, the second casing half 24 is provided with isolation walls 120 which align with the isolation walls 20 of the opposing half. In this embodiment, closely-spaced protrusions 30 or pins are disposed along the inward faces of the walls 120 and which mate with indentations in the first casing half 10. The alternative is also equivalent. The protrusions 30, from whichever casing half, either extend directly through perforations 34 in the circuit card 32 or press along the periphery of the circuit card 32. The perforations 34 must be plated-through or the periphery must be edge plated to form a grounded boundary at and along the edge of the circuit card 32. The protrusions 30 provide a conductive path between the casing halves and the circuit card at the isolation walls 120 and 20 and along the inside of the flange 14. This structure further enhances internal as well as external r.f. shielding.

The invention has now been explained with reference to specific embodiments. Other embodiments will be apparent to those of ordinary skill in the art. It is therefore not intended that this invention be limited except by the appended claims.

What is claimed is:

1. A shield against electromagnetic energy for an electromagnetic circuit card, said shield comprising:

a box enclosure for said electromagnetic circuit card, said box enclosure having a first casing and a second casing, said first casing having a solid first flange of a first contour defining side walls surrounding said electromagnetic circuit card and said second casing having a second flange of a second contour defining side walls, wherein said second flange comprises closely-spaced fingers, said fingers confronting, being in electrical contact with and mating in substantially full length with said first contour along substantially the entire periphery of said side walls.

2. The shield according to claim 1 wherein said fingers are spaced from one another at a distance substantially less than ¼ wavelength of a measurable harmonic of a fundamental operating frequency of said electromagnetic circuit.

3. The shield according to claim 1 wherein said fingers are flat plates having a face for flexibly confronting said first contour.

4. The shield according to claim 3 wherein said second casing is formed of metallized plastic, and wherein said fingers flexibly conform to said first contour.

5. The shield according to claim 1 wherein said side walls are disposed within boundaries defined by said fingers.

6. The shield according to claim 5 wherein said first casing further includes a lip disposed in parallel to said side walls to define a receiving slot for said fingers.

7. The shield according to claim 6 wherein said electromagnetic circuit card has a plated periphery and further including a plurality of closely-spaced pins mating to said periphery and coupling said first casing to said second casing through said periphery.

8. The shield according to claim 6 wherein said electromagnetic circuit card has a periphery of grounded perforations and said first casing further includes a plurality of closely-spaced pins mating to said perforations and coupling said first casing to said second casing through said periphery.

9. A shield against electromagnetic energy for an electromagnetic circuit card, said shield comprising:

a box enclosure for said electromagnetic circuit card, said box enclosure having a first casing and a second casing, said second casing being formed of metallized plastic, said first casing having a solid first flange of a first contour defining side walls surrounding said electromagnetic circuit card and said second casing having a second flange of a second contour defining side walls, wherein said second flange comprises closely-spaced fingers, said fingers confronting, being in electrical contact with and mating in substantially full length with said first contour along substantially the entire periphery of said side walls, wherein said fingers are flat plates having a face for flexibly confronting said first contour and are spaced from one another at a distance substantially less than ¼ wavelength of a measurable harmonic of a fundamental operating frequency of said electromagnetic circuit.

10. The shield according to claim 9 wherein said first casing further includes a lip disposed in parallel to said side walls to define a receiving slot for said fingers.

11. The shield according to claim 10 wherein said electromagnetic circuit card has a plated periphery and further including a plurality of closely-spaced pins mating to said periphery and coupling said first casing to said second casing through said periphery.

12. A shield against electromagnetic energy for an electromagnetic circuit card, said shield comprising:

a box enclosure for said electromagnetic circuit card, said box enclosure having a first casing and a second casing, said first casing having a solid first flange of a first contour defining side walls surrounding said electromagnetic circuit card and said second casing having a second flange of a second contour defining side walls, wherein said second flange comprises fingers spaced from one another at a distance substantially less than ¼ wavelength of a measurable harmonic of a fundamental operating frequency of said electromagnetic circuit, said fingers confronting, being in electrical contact with and mating in substantially full length with said first contour along substantially the entire periphery of said side walls.

13. A shield against electromagnetic energy for an electromagnetic circuit card having a plated periphery, said shield comprising:

a box enclosure for said electromagnetic circuit card, said box enclosure comprising
     a first casing having a solid first flange of a first contour defining side walls surrounding said electromagnetic circuit card and a lip disposed in parallel to said side walls;
     a second casing having a second flange of a second contour defining side walls, wherein said second flange comprises closely-spaced fingers, said side walls disposed within boundaries defined by said fingers, said fingers confronting, being in electrical contact with and mating in substantially full length with said first contour along substantially the entire periphery of said side walls, said lip and said side walls defining a receiving slot for said fingers; and
     a plurality of closely-spaced pins mating to said periphery and coupling said first casing to said second casing through said periphery.

14. A shield against electromagnetic energy for an electromagnetic circuit card having a periphery of grounded perforations, said shield comprising:

a box enclosure for said electromagnetic circuit card, said box enclosure comprising
     a first casing having a solid first flange of a first contour defining side walls surrounding said electromagnetic circuit card and a lip disposed in parallel to said side walls;
     a second casing having a second flange of a second contour defining side walls, wherein said second flange comprises closely-spaced fingers, said side walls disposed within boundaries defined by said fingers, said fingers confronting, being in electrical contact with and mating in substantially full length with said first contour along substantially the entire periphery of said side walls, said lip and said side walls defining a receiving slot for said fingers; and
     a plurality of closely-spaced pins mating to said perforations and coupling said first casing to said second casing through said periphery.

15. A shield against electromagnetic energy for an electromagnetic circuit card, said shield comprising:

a first casing having a first flange defining side walls having an inner perimeter and an outer perimeter and bordering said electromagnetic circuit card; and a second casing comprising:
- a solid wall having a periphery substantially similar to said inner perimeter of said first flange; and
- a second flange comprising fingers having an inner periphery substantially similar to said outer perimeter of said first flange, said solid wall and said second flange defining a channel adapted to receive said first flange.

16. An electromagnetic shield for use with a circuit card having a plurality of conductive through holes in a conductive pattern on said card, said shield comprising:
- a first casing;
- a second casing; and
- a plurality of closely-spaced pins, arranged in accordance with said pattern, coupling said first casing to said second casing through said through holes.

17. The electromagnetic shield of claim 16 wherein said conductive pattern is disposed about a periphery of said circuit card, at least said first casing being physically coupled to at least a portion of said pattern.

18. The electromagnetic shield of claim 16 wherein said conductive pattern is disposed within a periphery of said circuit card, at least said first casing being physically coupled to at least a portion of said pattern to provide electromagnetic shielding between a first portion of said circuit card and a second portion of said circuit card.

* * * * *